US009184093B2

(12) United States Patent
Naik et al.

(10) Patent No.: US 9,184,093 B2
(45) Date of Patent: Nov. 10, 2015

(54) INTEGRATED CLUSTER TO ENABLE NEXT GENERATION INTERCONNECT

(71) Applicant: Applied Materials, Inc., Santa Clara, CA (US)

(72) Inventors: Mehul B. Naik, San Jose, CA (US); Abhijit Basu Mallick, Fremont, CA (US); Kiran V. Thadani, Sunnyvale, CA (US); Zhenjiang Cui, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/180,098

(22) Filed: Feb. 13, 2014

(65) Prior Publication Data

US 2014/0273430 A1 Sep. 18, 2014

Related U.S. Application Data

(60) Provisional application No. 61/790,352, filed on Mar. 15, 2013.

(51) Int. Cl.
*H01L 21/44* (2006.01)
*H01L 21/768* (2006.01)
*H01L 23/532* (2006.01)

(52) U.S. Cl.
CPC .... *H01L 21/76885* (2013.01); *H01L 21/76834* (2013.01); *H01L 21/76852* (2013.01); *H01L 21/76867* (2013.01); *H01L 23/5329* (2013.01); *H01L 23/53233* (2013.01); *H01L 23/53261* (2013.01); *H01L 23/53295* (2013.01); *H01L 23/53238* (2013.01); *H01L 23/53266* (2013.01); *H01L 2924/0002* (2013.01)

(58) Field of Classification Search
None
See application file for complete search history.

(56) References Cited

U.S. PATENT DOCUMENTS

| 7,932,176 | B2 | 4/2011 | Gordon et al. |
| 8,586,487 | B2 | 11/2013 | Nguyen et al. |
| 2007/0173055 | A1* | 7/2007 | Ohtsuka et al. ............... 438/627 |
| 2011/0163062 | A1 | 7/2011 | Gordon et al. |
| 2012/0252206 | A1 | 10/2012 | Naik et al. |
| 2013/0217240 | A1 | 8/2013 | Mallick et al. |
| 2013/0217241 | A1 | 8/2013 | Underwood et al. |

OTHER PUBLICATIONS

Koike, et al.; Applied Physics Letters 87; Self-Forming Diffusion Barrier Layer in Cu—Mn Alloy Metallization; 3 total pages; 2005.

* cited by examiner

*Primary Examiner* — Marvin Payen
(74) *Attorney, Agent, or Firm* — Patterson & Sheridan, LLP

(57) ABSTRACT

Embodiments of the present invention generally relate to methods for forming a metal structure and passivation layers. In one embodiment, metal columns are formed on a substrate. The metal columns are doped with manganese, aluminum, zirconium, or hafnium. A dielectric material is deposited over and between the metal columns and then cured to form a passivation layer on vertical surfaces of the metal columns.

18 Claims, 7 Drawing Sheets

INTEGRATED CLUSTER TO ENABLE NEXT GENERATION INTERCONNECT

CROSS-REFERENCE TO RELATED APPLICATIONS

This application claims benefit of U.S. Provisional Patent Application Ser. No. 61/790,352, filed Mar. 15, 2013, which is herein incorporated by reference.

BACKGROUND

1. Field

Embodiments of the present invention generally relate to a process of forming an encapsulation layer.

2. Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance of such components. For example, low resistivity metal interconnects provide conductive paths between the components on integrated circuits.

One method for forming vertical and horizontal interconnects is by a damascene or dual damascene method. In the damascene method, one or more dielectric materials, such as the low k dielectric materials, are deposited and pattern etched to form the vertical interconnects, i.e. vias, and horizontal interconnects, i.e., lines. Conductive materials, such as copper containing materials, and other materials, such as barrier layer materials used to prevent diffusion of copper containing materials into the surrounding low k dielectric, are then inlaid into the etched pattern. However, due to the size induced resistivity effects, conventional damascene process flows may soon reach a scaling impasse.

Therefore, an improved method of forming the metal interconnects and passivation layers to prevent metal diffusion is needed.

SUMMARY

Embodiments of the present invention generally relate to methods for forming a metal structure and passivation layers. In one embodiment, metal columns are formed on a substrate. The metal columns are doped with manganese, aluminum, zirconium, or hafnium. A dielectric material is deposited over and between the metal columns and then cured to form a passivation layer on vertical surfaces of the metal columns.

In one embodiment, a method for forming passivation layers is disclosed. The method includes forming metal columns over a substrate, and each metal column is doped with manganese, aluminum, zirconium, or hafnium. The method further includes depositing a dielectric material between and over the metal columns, and curing the dielectric material to form a passivation layer on vertical surfaces of the metal columns.

In another embodiment, a method for forming passivation layers is disclosed. The method includes forming metal columns over a substrate, selectively depositing a conformal layer comprising manganese, aluminum, zirconium, or hafnium on vertical surfaces of the metal columns, depositing a dielectric material between and over the metal columns and the conformal layer, and curing the dielectric material to form a passivation layer on the vertical surfaces of the metal columns.

In another embodiment, a method for forming passivation layers is disclosed. The method includes forming metal columns over a substrate, depositing a dielectric layer comprising silicon nitride or carbon doped silicon nitride over the metal columns and the substrate and on vertical surfaces of the metal columns, depositing a dielectric material between and over the dielectric layer, and curing the dielectric material to form a passivation layer over and on the vertical surfaces of the metal columns.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to methods for forming a metal structure and passivation layers. In one embodiment, metal columns are formed on a substrate. The metal columns are doped with manganese, aluminum, zirconium, or hafnium. A dielectric material is deposited over and between the metal columns and then cured to form a passivation layer on vertical surfaces of the metal columns.

Figure 1A:
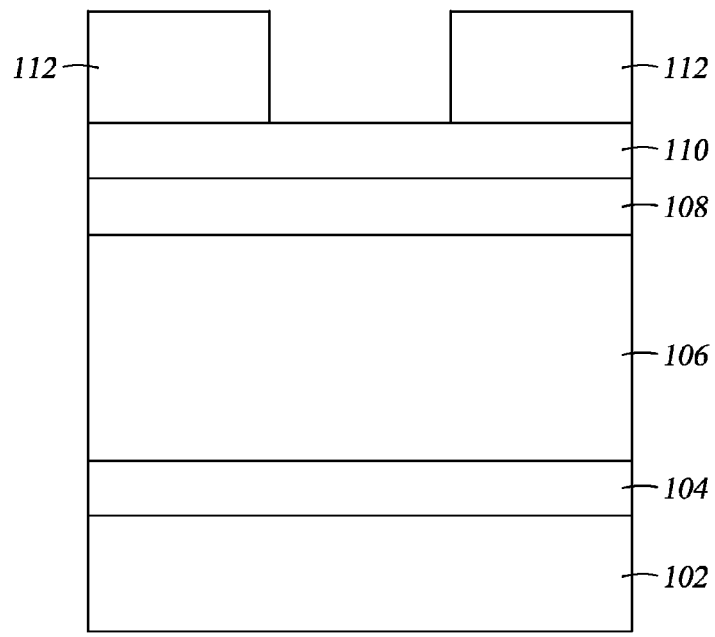
FIGS. 1A-1D depict schematic cross sectional views of a patterned feature on a substrate at different process steps according to an embodiment described herein.
Figure 1B:
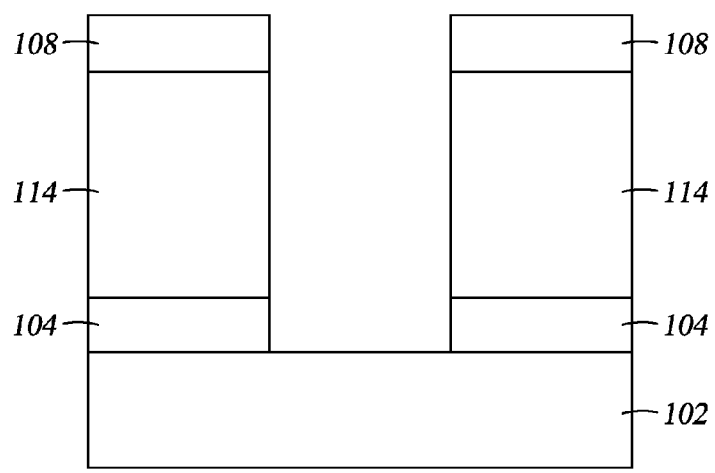

FIGS. 1A-1D depict schematic cross sectional views of a patterned feature 100 on a substrate at different process steps according to an embodiment described herein. As shown in FIG. 1A, a metal barrier layer 104 is disposed over a layer 102. The layer 102 may be a dielectric layer disposed over conductive contacts disposed at a lower level. The barrier layer 104 may include one or more barrier materials such as, for example, tantalum, tantalum nitride, tantalum silicon nitride, titanium, titanium nitride, titanium silicon nitride, tungsten nitride, silicon nitride, ruthenium nitride, derivatives thereof, alloys thereof and combinations thereof. The barrier layer 104 may be formed using a suitable deposition process, such as atomic layer deposition (ALD), chemical vapor deposition (CVD), physical vapor deposition (PVD) or electroless deposition.

A conductive layer 106 is disposed over the barrier layer 104. The conductive layer 106 may be a doped metal such as copper (Cu), cobalt (Co), or tungsten (W) doped with manganese (Mn), aluminum (Al), zirconium (Zr), or hafnium (Hf). The conductive layer 106 may be a doped silicide such as nickel silicide or cobalt silicide doped with Mn, Al, Zn, or Hf. In one embodiment, the conductive layer 106 is Cu doped with Mn. A metal etch hard mask layer 108 is disposed over the conductive layer 106 and a bottom anti reflecting coating (BARC) layer 110 is disposed over the metal etch hard mask layer 108. A photoresist layer 112 is disposed over the BARC layer 110. One or more reactive ion etching (RIE) processes are performed to transfer the pattern of the photoresist layer 112 to the BARC layer 110, the metal etch hard mask layer 108, and the conductive layer 106. The remaining photoresist layer 112 and the BARC layer 110 are subsequently removed, leaving metal columns 114 sandwiched between the metal etch hard mask layer 108 and the barrier layer 104, as shown in FIG. 2B.

Alternatively, the metal columns 114 may be formed with a sacrificial layer. The sacrificial layer, such as silicon oxide, may be deposited over the layer 102 before the deposition of the conductive layer 106. Trenches are formed in the sacrificial layer and the conductive layer 106 and barrier layer 104 are deposited into the trenches. The sacrificial layer is subsequently removed, forming the metal columns 114.

Figure 1C:
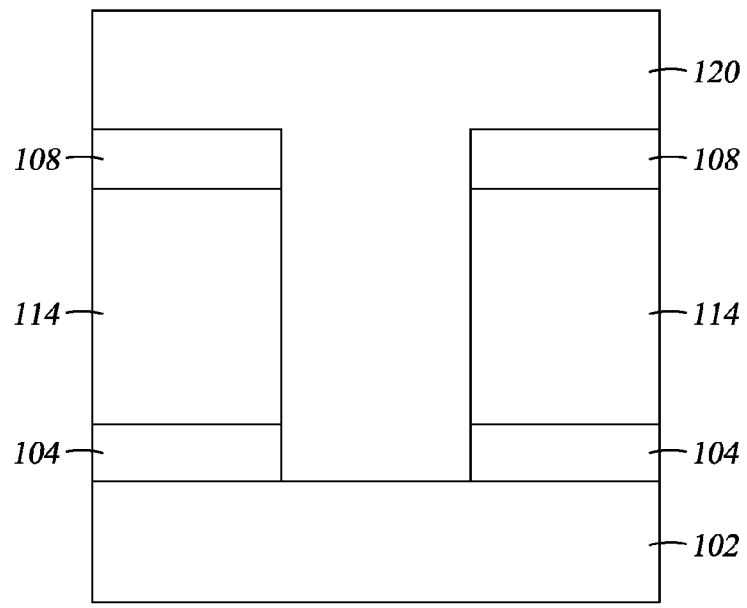
Figure 1D:
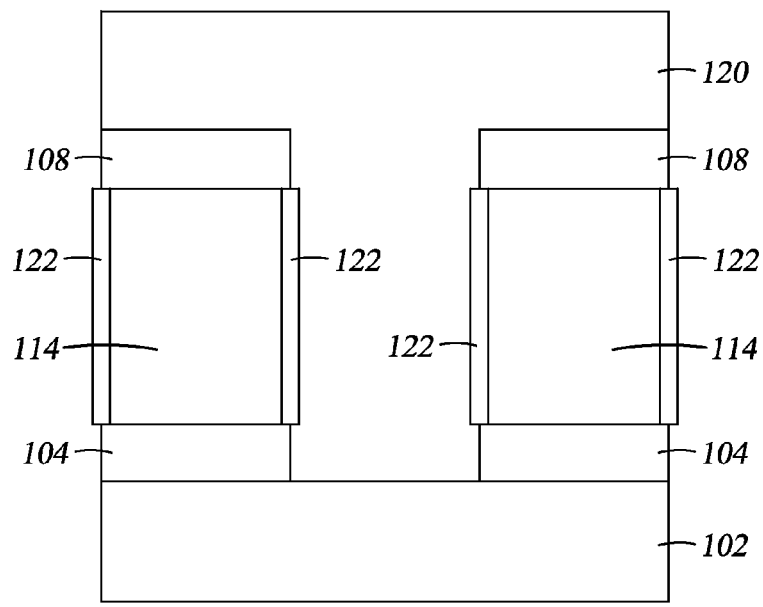

After the formation of the metal columns 114, a degas and pre-clean process is performed to remove any moisture and to reduce any metal oxide. The pre-clean process may be varied ranging from $H_2$ anneal to $H_2$ or $NH_3$ plasmas or derivatives of the same. In an integrated fashion (under vacuum), the substrate is moved to a process chamber, where a flowable low k dielectric film 120 is deposited over and between the metal columns 114, the metal etch hard mask layer 108 and the barrier layer 104, as shown in FIG. 1C. The low k dielectric film 120 may include carbon-containing silicon oxides (SiOC), such as BLACK DIAMOND® and BLACK DIAMOND® II available from Applied Materials, Inc., of Santa Clara, Calif.

Next, the substrate may be transferred to another process chamber while under vacuum. The low k dielectric film 120 is cured through a thermal process combined with UV or e-beam as additional energy sources. Alternatively, the curing of the dielectric film 120 may be performed in the same chamber where the low k dielectric film 120 is deposited.

The curing temperature is about 400 degrees Celsius or higher, and at this temperature, the dopants in the metal columns 114 out diffuse to the vertical surfaces of the metal columns 114. The dopants' out diffusion is not only due to the thermal considerations, but also the dopants' affinity to oxygen, which is a component of the low k dielectric film 120. At the interface between the vertical surfaces of the metal columns 114 and the low k dielectric film 120, the dopants react with oxygen and silicon in the low k dielectric film 120, forming silicate type passivation layers 122. The passivation layers 122 may comprise manganese silicate ($MnSiO_x$), aluminum silicate ($AlSiO_x$), zirconium silicate ($ZrSiO_x$), or hafnium silicate ($HfSiO_x$). The silicate type passivation layers 122 may prevent metal diffusion into the dielectric film 120, hence passivate the metal columns. The passivation layers 122 are self-aligned when self-formed on exposed metal surfaces.

Figure 2A:
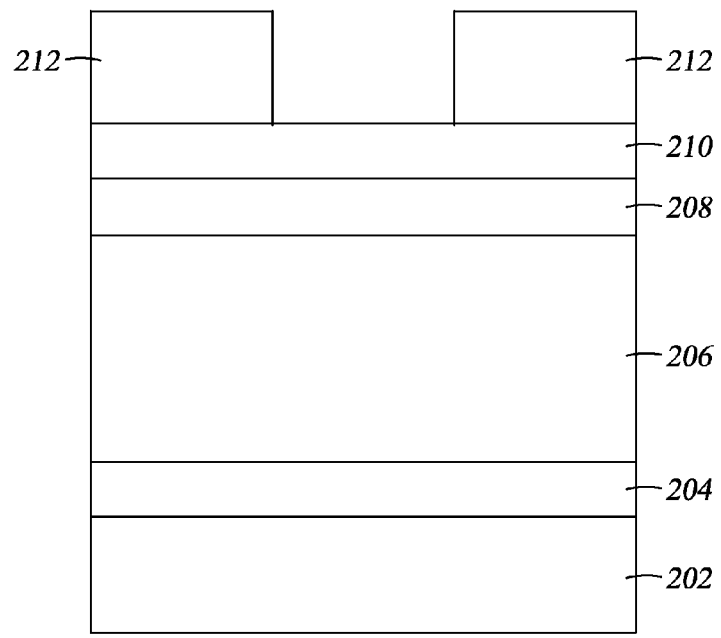
FIGS. 2A-2E depict schematic cross sectional views of a patterned feature on a substrate at different process steps according to an embodiment described herein.
Figure 2B:
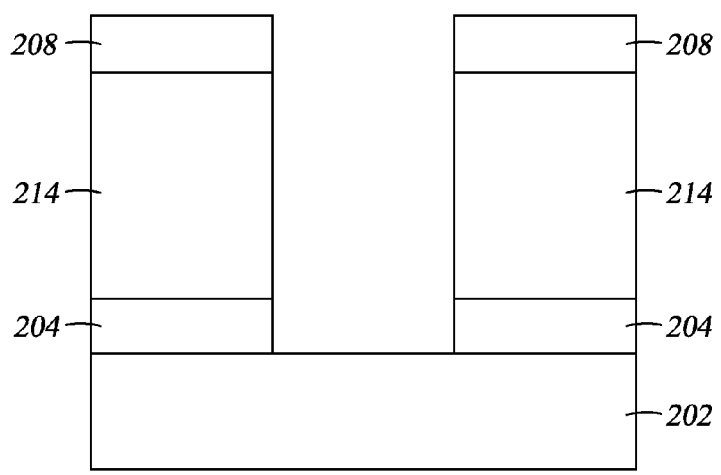

FIGS. 2A-2E depict schematic cross sectional views of a patterned feature 200 on a substrate at different process steps according to an embodiment described herein. As shown in FIG. 2A, the substrate has a conductive layer 206 is disposed over a barrier layer 204 and a dielectric layer 202. The conductive layer 206 may be a metal such as Cu, Co, W or a silicide such as nickel silicide or cobalt silicide. In one embodiment, the conductive layer 206 is Cu. A photoresist layer 212, a BARC layer 210, and a metal etch hard mask layer 208 are disposed over the conductive layer 206.

Figure 2C:
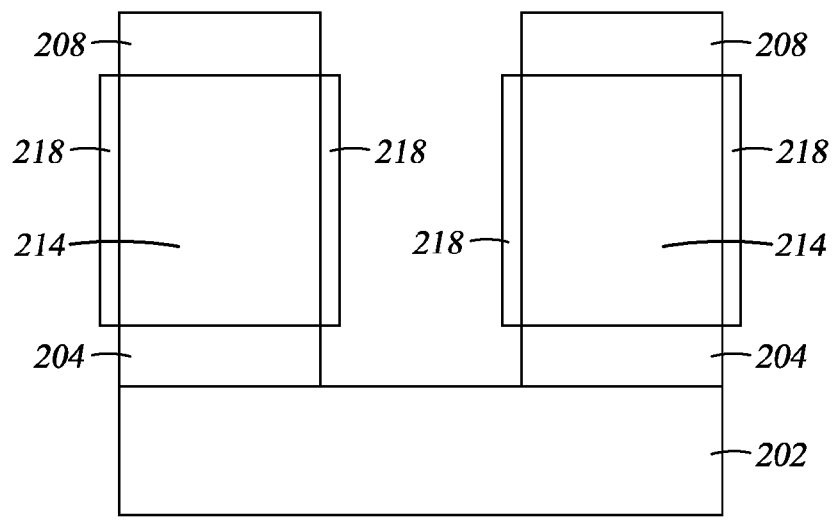

One or more RIEs are performed to transfer the pattern of the photoresist layer 212 to the conductive layer 206. As a result, metal columns 214 are formed, as shown in FIG. 2B. A degas and pre-clean process is performed to remove any moisture and to reduce any metal oxide. The pre-clean process may be varied ranging from $H_2$ anneal to $H_2$ or $NH_3$ plasmas or derivatives of the same. In an integrated fashion (under vacuum), the substrate is moved to a process chamber in which conformal layers 218 are selectively deposited on the vertical surfaces of the metal columns 214. The conformal layer 218 comprises Mn, Al, Zr, or Hf. The selective deposition of the conformal layers 218 on the vertical surfaces of the metal columns 214 may be achieved by first deactivating the surfaces of the dielectric layer 202, the barrier layer 204, and the metal etch hard mask layer 208. The deactivation may be accomplished by any suitable method, such as reacting the surfaces to be deactivated with alkylsilane compounds either in vapor phase or in solution. After the surfaces of the dielectric layer 202, the barrier layer 204, and the metal etch hard mask layer 208 are deactivated, the conformal layers 218 may be deposited by CVD and the conformal layers 218 would only formed on the vertical surfaces of the metal columns 214, as shown in FIG. 2C.

Figure 2D:
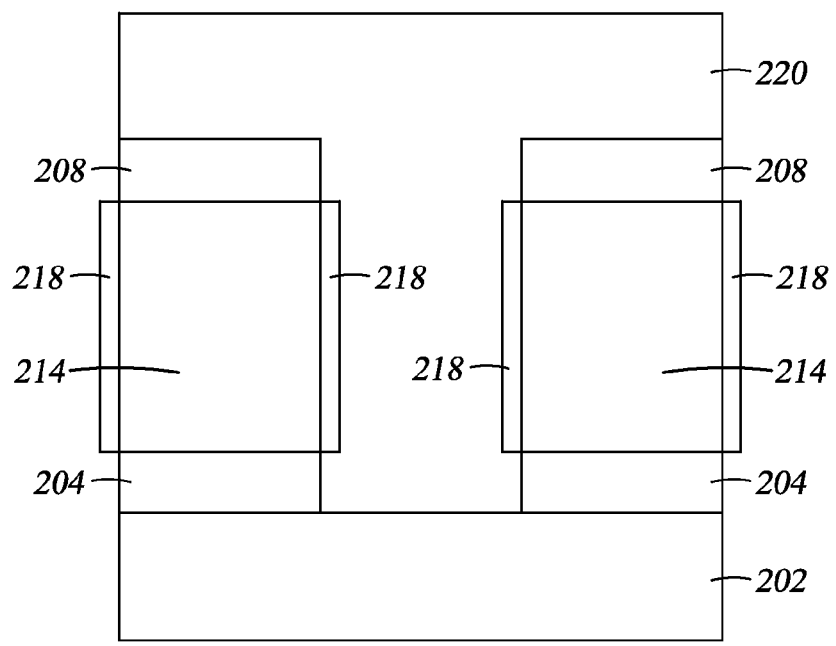
Figure 2E:
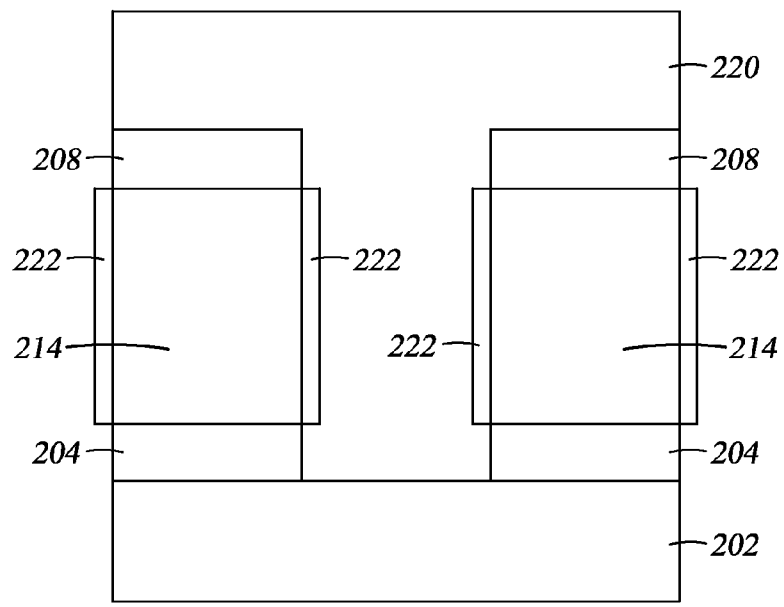

In an integrated fashion (under vacuum), the substrate is moved to a process chamber, where a flowable low k dielectric film 220 is deposited over and between the metal columns 214, the conformal layers 218, the metal etch hard mask layer 208 and the barrier layer 204, as shown in FIG. 2D. The low k dielectric film 120 may include carbon-containing silicon oxides (SiOC), such as BLACK DIAMOND® and BLACK DIAMOND® II available from Applied Materials, Inc., of Santa Clara, Calif. The deposition of the low k dielectric film 220 is at a low temperature where the conformal layers 218 would not react with the oxygen and the silicon in the dielectric film 220.

Next, the substrate may be transferred to another process chamber while under vacuum. The low k dielectric film 220 is cured through a thermal process combined with UV or e-beam as additional energy sources. Alternatively, the curing of the dielectric film 220 may be performed in the same chamber where the low k dielectric film 220 is deposited.

The curing temperature is about 400 degrees Celsius or higher, and at this temperature, conformal layers 218 react with oxygen and silicon in the low k dielectric film 220, forming silicate type passivation layers 222. The passivation layers 222 may comprise manganese silicate ($MnSiO_x$), aluminum silicate ($AlSiO_x$), zirconium silicate ($ZrSiO_x$), or hafnium silicate ($HfSiO_x$). The silicate type passivation layers 222 may prevent metal diffusion into the dielectric film 220, hence passivate the metal columns. The passivation layers 222 are self-aligned when self-formed on exposed metal surfaces.

Figure 3A:
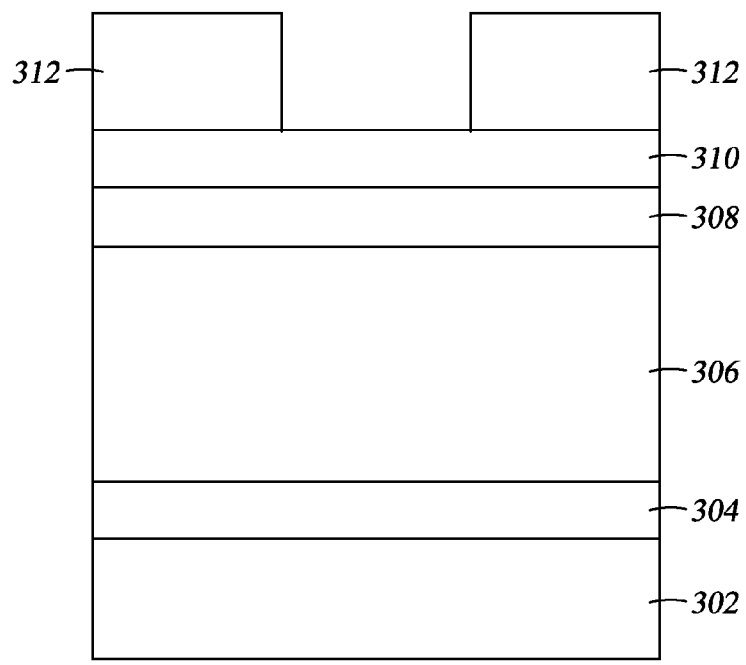
FIGS. 3A-3E depict schematic cross sectional views of a patterned feature on a substrate at different process steps according to an embodiment described herein.

FIGS. 3A-3E depict schematic cross sectional views of a patterned feature 300 on a substrate at different process steps according to an embodiment described herein. As shown in FIG. 3A, the substrate has a conductive layer 306 disposed over a barrier layer 304 and a dielectric layer 302. The conductive layer 306 may be a metal such as Cu, Co, or W. The conductive layer 306 may also be a silicide such as nickel silicide or cobalt silicide. In one embodiment, the conductive layer 306 is Cu. A photoresist layer 312, a BARC layer 310, and a metal etch hard mask layer 308 are disposed over the conductive layer 306.

Figure 3B:
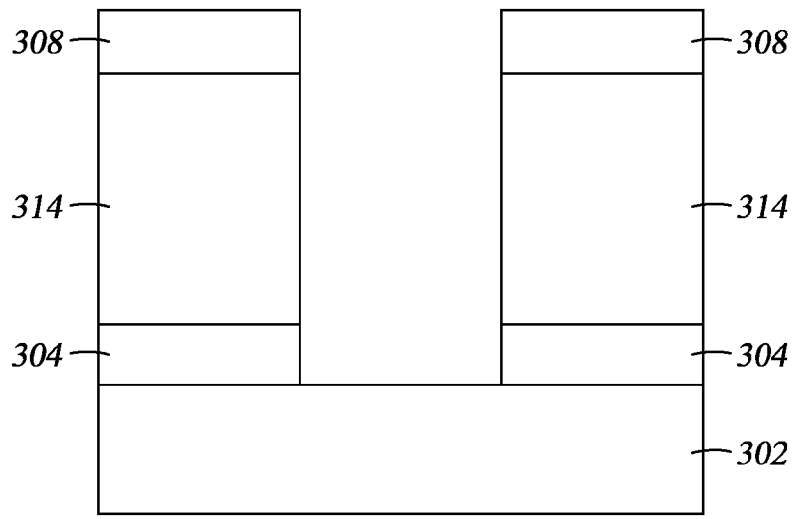

Again one or more RIEs may be performed to form metal columns 314, as shown in FIG. 3B, and a degas and pre-clean process may be performed to remove any moisture and to reduce any metal oxide.

Figure 3C:
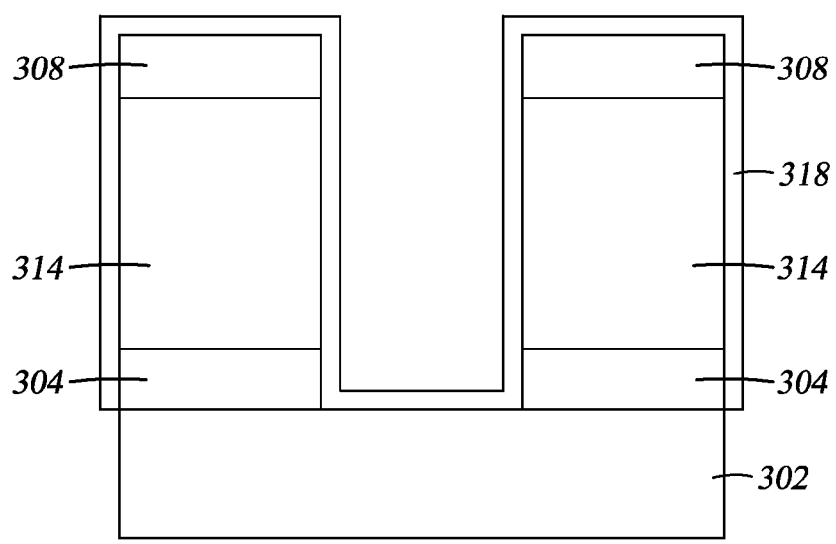

Next, as shown in FIG. 3C, a dielectric layer 318 is conformally deposited over the dielectric layer 302 and the metal etch hard mask layer 308, and on the sides of the metal etch hard mask layer 308, the metal columns 314, and the barrier layer 304. The dielectric layer 318 may be silicon nitride (SiN), or carbon doped silicon nitride (SiCN). If the dielectric layer is deposited at a high temperature in excess to 300 degrees Celsius, and the thickness of the dielectric layer is between about 1 to about 10 nm, the dielectric layer may have good barrier properties. However, the dielectric layer deposited at over 300 degrees Celsius does not provide sufficient counter stress to prevent hillocking of the metal columns 314 under temperature excursion. Thus, the dielectric layer 318 may be deposited at a lower temperature, such as between about 50 degrees Celsius to about 200 degrees Celsius.

In one embodiment, the dielectric layer 318 is a SiCN layer and is deposited by CVD. The silicon-containing precursors may also contain carbon for the CVD of SiCN layer. The silicon containing precursors may be 1,3,5-trisilapentane, 1,4,7-trisilaheptane, disilacyclobutane, trisilacyclohexane, 3-methylsilane, silacyclopentene, silacyclobutane, and trimethylsiylacetylene, among others. In addition to the silicon-containing precursor, an energized nitrogen-containing precursor, such as ammonia, hydrazine, amines, NO, N$_2$O, or NO$_2$ may be added to the deposition chamber. The energized nitrogen-containing precursor may contribute some or all of the nitrogen constituent in the deposited SiCN layer.

Figure 3D:
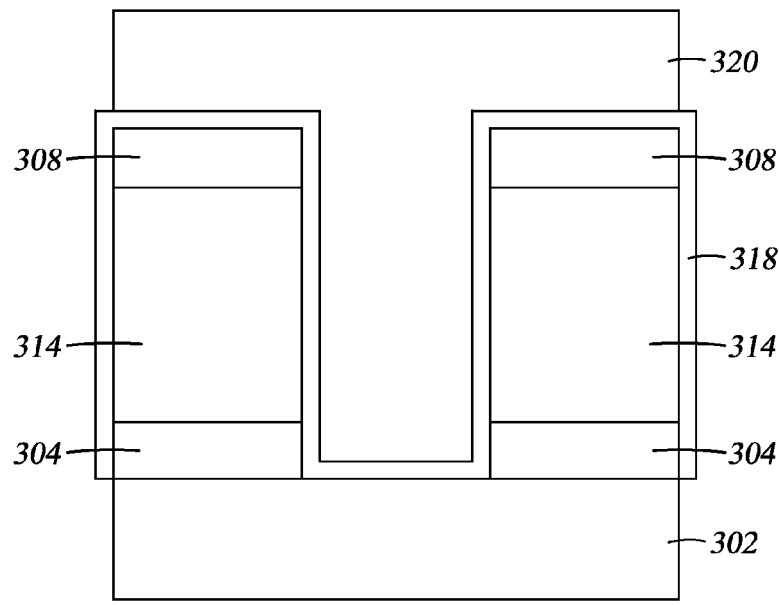
Figure 3E:
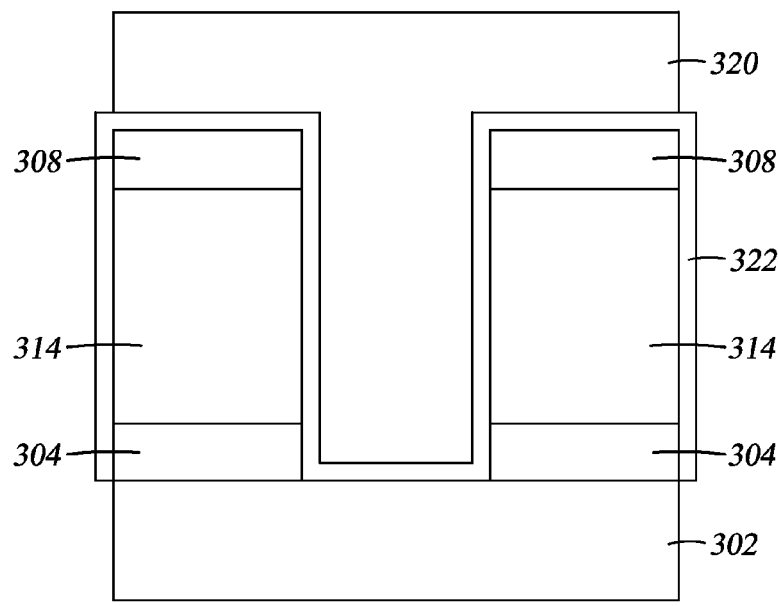

After the dielectric layer 318 is deposited, the substrate is moved to a process chamber in an integrated fashion (under vacuum), where a flowable low k dielectric film 320 is deposited over the dielectric layer 318, as shown in FIG. 3D. The low k dielectric film 320 may include carbon-containing silicon oxides (SiOC), such as BLACK DIAMOND® and BLACK DIAMOND® II available from Applied Materials, Inc., of Santa Clara, Calif.

The substrate may be transferred to another process chamber while under vacuum. The low k dielectric film 320 is cured through a thermal process combined with UV or e-beam as additional energy sources. Alternatively, the curing of the dielectric film 320 may be performed in the same chamber where the low k dielectric film 320 is deposited.

The curing temperature is about 400 degrees Celsius or higher, and at this temperature, the silicon-hydrogen and silicon-hydroxide bonds in the dielectric layer 318 are reduced, enhancing cross-linking and densification. Therefore, the dielectric layer 318 now has good barrier properties, thus becoming a passivation layer 322. Other treatments of the dielectric layer 318, such as by high density plasma (HDP), e-beam, microwave, or implantation, may also improve the barrier properties of the dielectric layer 318, thus, forming the passivation layer 322.

In summary, methods for forming passivation layers for metal columns are disclosed. The passivation layers may be self-formed and self-aligned during the curing process of the low k dielectric layer, as a result of the dopants in the metal columns moving to the interface and reacting with the oxygen and silicon in the low k dielectric layer.

While the foregoing is directed to embodiments of the present invention, other and further embodiments of the invention may be devised without departing from the basic scope thereof, and the scope thereof is determined by the claims that follow.

The invention claimed is:

1. A method for forming passivation layers, comprising:
    forming metal columns over a substrate, wherein each metal column has vertical surfaces and is doped with manganese, aluminum, zirconium, or hafnium;
    depositing a dielectric material between and over the metal columns; and
    curing the dielectric material to form a passivation layer on the vertical surfaces of the metal columns.

2. The method of claim 1, wherein the metal columns are formed by forming a metal layer over the substrate and performing one or more reactive ion etching processes on the metal layer.

3. The method of claim 1, wherein the metal columns are formed by depositing a sacrificial layer over the substrate, forming a plurality of trenches in the sacrificial layer, depositing a metal layer into the trenches, and removing the sacrificial layer.

4. The method of claim 1, wherein the dielectric material is a low k dielectric film.

5. The method of claim 1, wherein the dielectric material includes carbon-containing silicon oxides.

6. The method of claim 1, further comprising a pre-clean process before depositing the dielectric material between and over the metal columns.

7. The method of claim 1, wherein the metal columns comprises copper, cobalt, tungsten, nickel silicide, or cobalt silicide.

8. The method of claim 1, wherein the curing the dielectric material is performed by a thermal process combined with UV or e-beam as additional energy source.

9. The method of claim 1, wherein the curing the dielectric material is performed at a temperature of about 400 degrees Celsius or greater.

10. The method of claim 1, wherein the passivation layer comprises manganese silicate, aluminum silicate, zirconium silicate, or hafnium silicate.

11. A method, comprising:
    forming metal columns over a substrate, wherein each metal column is doped with manganese, aluminum, zirconium, or hafnium;
    depositing a dielectric material between and over the metal columns, wherein the dielectric material is in contact with surfaces on sides of each metal column; and
    curing the dielectric material to form a passivation layer on the surfaces of each metal column.

12. The method of claim 11, wherein the dielectric material comprises a low k dielectric material.

13. The method of claim 11, wherein the dielectric material comprises carbon-containing silicon oxides.

14. The method of claim 11, wherein each metal column further comprises doped copper, cobalt, or tungsten.

15. A method, comprising:
    forming a dielectric layer over a substrate;
    forming a barrier layer on the dielectric layer;
    forming a conductive layer on the barrier layer, wherein the conductive layer comprises a doped metal;
    removing portions of the conductive layer to form metal column;
    depositing a dielectric material between and over the metal columns, wherein the dielectric material is in contact with surfaces on sides of each metal column; and
    curing the dielectric material to form a passivation layer on the surfaces of each metal column.

16. The method of claim 15, wherein the doped metal of the conductive layer comprises a metal doped with manganese, aluminum, zirconium, or hafnium.

17. The method of claim 15, wherein the dielectric material comprises a low k dielectric material.

18. The method of claim 17, wherein the dielectric material comprises carbon-containing silicon oxides.

* * * * *